United States Patent [19]

Hall, Jr.

[11] 3,992,229

[45] Nov. 16, 1976

[54] THERMOELECTRIC DEVICE

[76] Inventor: Bertie F. Hall, Jr., 3568 Kipling Road, Berkley, Mich. 48072

[22] Filed: Mar. 12, 1971

[21] Appl. No.: 123,901

Related U.S. Application Data

[63] Continuation of Ser. No. 706,071, Feb. 16, 1968, abandoned.

[52] U.S. Cl. .................................. 136/227; 136/222
[51] Int. Cl.² ........................................... H01V 1/00
[58] Field of Search .......... 136/227, 222, 230, 241, 136/225, 200; 73/361, 359

[56] References Cited

UNITED STATES PATENTS

| 839,985 | 1/1907 | Bristol | 136/227 |
|---|---|---|---|
| 1,550,272 | 8/1925 | Martin | 136/224 |
| 2,335,707 | 11/1943 | Streicher | 136/241 |
| 2,337,000 | 12/1943 | Ray | 136/227 |
| 3,307,402 | 3/1967 | Richardson | 73/361 |
| 3,337,371 | 8/1967 | Agafonov et al. | 136/241 |
| 3,451,859 | 6/1969 | Zysk et al. | 136/241 |
| 3,513,703 | 5/1970 | Young | 73/361 |
| 3,582,761 | 6/1971 | Hall, Jr. | 73/361 |

Primary Examiner—Harvey E. Behrend
Attorney, Agent, or Firm—Harness, Dickey & Pierce

[57] ABSTRACT

A thermoelectric device having constant voltage characteristics over an extended temperature range.

16 Claims, 11 Drawing Figures

Thermocouple Circuit With Reference Junction Compensation

FIG. 1. Output Curve For Idealized T/C

FIG. 2. Effective Curve By Two T/C's

FIG. 4. Thermocouple Circuit With Reference Junction Compensation

INVENTOR.
Bertie F. Hall, Jr.
BY Harness, Dickey & Pierce
ATTORNEYS.

THERMOELECTRIC DEVICE

This case is a continuation of application Ser. No. 706,071, filed Feb. 16, 1968, now abandoned.

The present invention relates to thermoelectric devices and more particularly to a thermoelectric device having a constant voltage versus temperature characteristic.

It is desirable for thermocouples to have a reference junction which is generally insensitive to temperature changes over a wide range; it is an object of the present invention to provide such a thermocouple.

It is desirable in some applications (instrumentation, etc.) to provide a constant voltage source; it is an object of the present invention to provide a thermoelectric device having a substantially constant voltage characteristic over a wide temperature range.

It is a general object to provide a new and useful thermoelectric device.

Other objects, features and advantages of the present invention will become apparent from the subsequent description and the appended claims, taken in conjunction with the accompanying drawings, in which:

A thermocouple constitutes a temperature sensitive battery in directly converting heat energy into electrical energy. It has no storage capacity, however, and its terminal voltage normally is determined by the temperature difference between the "hot" and "cold" ends. It does have an internal resistance to current flow, and this is a nearly constant operating value causing a predictable reduction of the terminal voltage as a function of current drain.

The difficulty in using a thermocouple or a plurality of thermocouples (thermopile) as a source of electrical energy is that the temperatures of both ends of the device must be well controlled in order to have a predictable terminal voltage. At least this is the primary difficulty with conventional thermocouple materials.

In the present invention materials are selected which exhibit a nonlinear characteristic such as a reversal of polarity in their relative thermal electromotive force curves (see curves of FIG. 3, note polarity reversal of 51 Ni - 49 Fe Alloy); with such materials it is possible to fabricate a thermoelectric battery which generates an open circuit terminal voltage of nearly constant value over a substantial temperature range. This permits the construction of new and useful thermocouples as well as the construction of a thermoelectric device having a substantially constant output voltage over substantial temperature ranges at both ends (hot and cold). As will be seen in more detail, the region of constant voltage occurs at areas of polarity reversal of the thermal E.M.F. versus temperature curve for a selected material and/or at an area in which the curves of two materials are generally parallel (see FIG. 3, note parallel area between curve for Iron and curve for 51 Ni - 49 Fe Alloy). Such a construction makes temperature control of the junctions of little importance and with good thermal design of the device the necessary control is accomplished by simply maintaining the temperature of one or more heaters for the junctions at selected magnitudes, which magnitudes need not be critically maintained.

Conventional thermocouple materials and combinations (see FIG. 3, note Chromel and Alumel relative to platinum and Chromel/Alumel combined) exhibit a temperature dependence which is nearly a direct proportion to the output voltage. This is desirable to simplify the construction of instruments to display the voltage generated by the thermocouple as a temperature value. Such thermocouples are intended to operate over a wide temperature range extending from subzero to very elevated temperatures.

There are three items of importance in using a thermocouple to measure a temperature of interest:

1. Hot junction temperature
2. Cold or reference junction temperature
3. Thermoelectric voltage generated For any conventional thermocouple it is necessary to establish the value of two of these quantities in order to deduce the third. Normally the hot junction temperature is the unknown quantity, and the instrument measures the voltage generated with the reference junction held at a known temperature such as the freezing point of water or effectively held at a specified temperature by some electrical circuitry utilizing temperature sensitive resistors.

The primary problem in utilizing the cold junction temperature is that for meaningful measurements, this temperature (and hence the reference junction potential) must be carefully held at a known temperature. It would be desirable to have the generated output voltage as a function of the hot junction temperature only. It is necessary that a temperature difference exist, however, in order to generate a thermoelectric potential difference.

An idealized construction would be one in which the reference junction (of cold end temperature) could vary over a considerable range without affecting the net circuit voltage.

Figure 1:
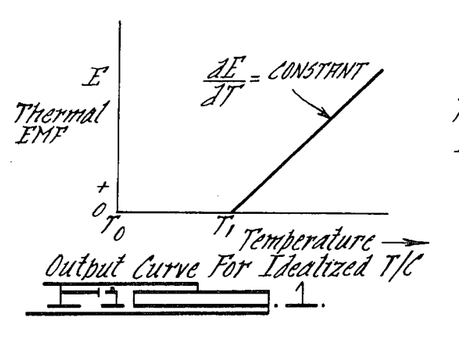
FIG. 1 is a graph depicting thermal E.M.F. versus temperature for an idealized thermocouple.

FIG. 1 illustrates a temperature versus thermal E.M.F. relationship for such an idealized thermocouple which will generate a voltage as a function of the hot junction only, as long as the cold end does not exceed $T_1$. The idealized thermocouple will have to be relatively sensitive to temperature variation for temperatures greater than $T_1$ and hence will have a relatively high constant thermoelectric power (de/dt). It has been found that the proper combinations of materials and/or junctions will provide a thermocouple having characteristics simulating those of the curve of FIG. 1.

Figure 2:
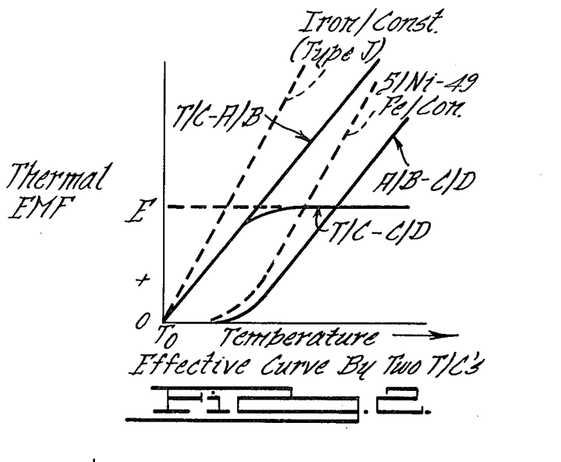
FIG. 2 is a graph depicting thermal E.M.F. versus temperature for two thermocouples having selected characteristics to provide a resultant curve simulating the idealized curve of FIG. 1.

FIG. 2 illustrates how two thermocouples may be used to approximate the curve of FIG. 1 as a net effect. For cold end temperatures between $T_o$ and $T_1$, the voltage generated in the circuit is a function of the hot junction only.

Figure 2A:
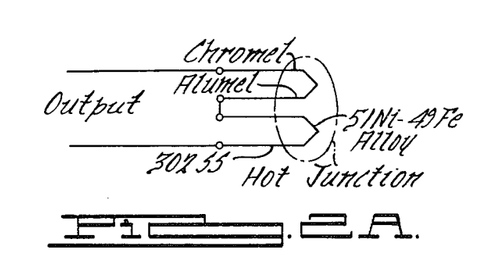
FIG. 2A is a schematic diagram of the two thermocouple arrangement providing the resultant curve of FIG. 2.

In FIG. 2 note that a thermocouple of materials A/B has a generally proportional temperature versus thermal E.M.F.; a thermocouple of materials C/D has a linear response (which is parallel with and coincides with the curve of thermocouple A/B) up to a temperature $T_1$, after which the response of thermocouple C/D flattens out to provide a generally constant voltage versus temperature response. By using the thermocouple A/B in series with C/D for the hot junction the output from the two thermocouples with be as represented by the curve A/B - C/D. FIG. 2A depicts the schematic of the combination thermocouple. The result will be a device which has a cold junction which can vary from $T_0$ to $T_1$ with substantially no affect on the hot junction which will provide for a generally proportional response from temperatures (at the hot junction) slightly above $T_1$.

While various combinations of materials could produce this general effect, an advantageous combination (to be discussed) has been discovered which results in a high temperature calibration curve of the same sensitivity of commonly used instruments and conventional thermocouples.

Figure 3:
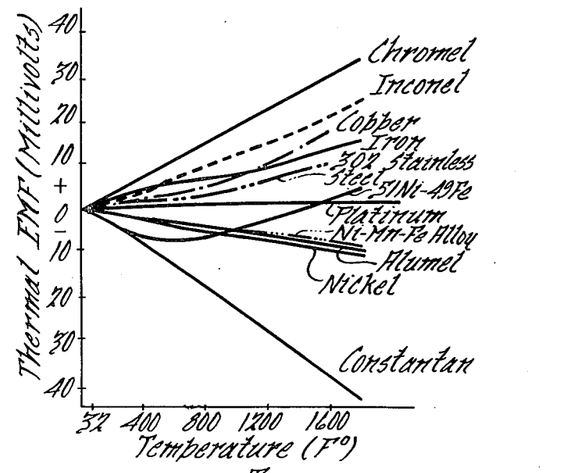
FIG. 3 is a graph depicting thermal E.M.F. versus temperature for various materials relative to platinum.

The mode of selecting materials can best be understood by reference to FIG. 3 which is a plot of thermal E.M.F. versus temperature for various materials relative to platinum. Note that all of the materials shown indicate a generally proportional voltage-temperature relationship; however, the alloy (nickel-iron) shows a nonlinear response which reverses over the temperature range shown. The reverse provides for a change on sign of the thermoelectric power (dE/dt) for the alloy. The curve for 302 stainless steel is initially nonlinear and later (at around 800° F) becomes generally linear. The curves of the alloy (nickel-iron) and for Type 302 stainless steel initially diverge and subsequently run parallel to each other. Thus, a thermocouple comprised of the nickel-iron alloy and Type 302 stainless steel could provide the response of thermocouple C/D of FIG. 2. A thermocouple comprised of Chromel/Alumel (type K), will provide the response of thermocouple A/B of FIG. 2. Thus, the combination (A/B - C/D) will operate with the same sensitivity (slope) as a conventional thermocouple of Type K (Chromel/Alumel) materials. The alloy of FIG. 3 (C/D of FIG. 2) is approximately 51% nickel and 49% iron.

By application of the concepts of the present invention a single thermocouple could be made having characteristics similar to the curve of FIG. 1. Looking to FIG. 2, the curve for Iron/Constantan (Type J) thermocouple is shown (in dotted lines) and indicates a desirable response curve. Looking to FIG. 3, the curves for iron and for the nickel-iron alloy generally are parallel above around 800° F. However, the curve for the nickel-iron alloy and for constantan generally coincide at the low temperature range i.e. around 0° F to around 300° F. In combining the two to form a thermocouple the result is the curve (dotted in FIG. 2) for the Nickel-Iron Alloy/Constantan which shows zero output at the low temperatures and at higher temperatures shows a thermoelectric power (dE/dt) similar to that of the commercial type J thermocouple.

One significant advantage offered by the above combinations (i.e. the combination of two thermocouples and the single thermocouple of FIG. 2) is the elimination of the need for special wires to connect between the resultant thermocouple device and the recording instrument. Commercially available instruments can be used with the only modification being the change of the scale range. For example: a scale of 0 – 200 – 400 – 600 – 800° F. would become 0 – 600 – 800 – 1000 – 1200° F.

Figures 3A, 4:
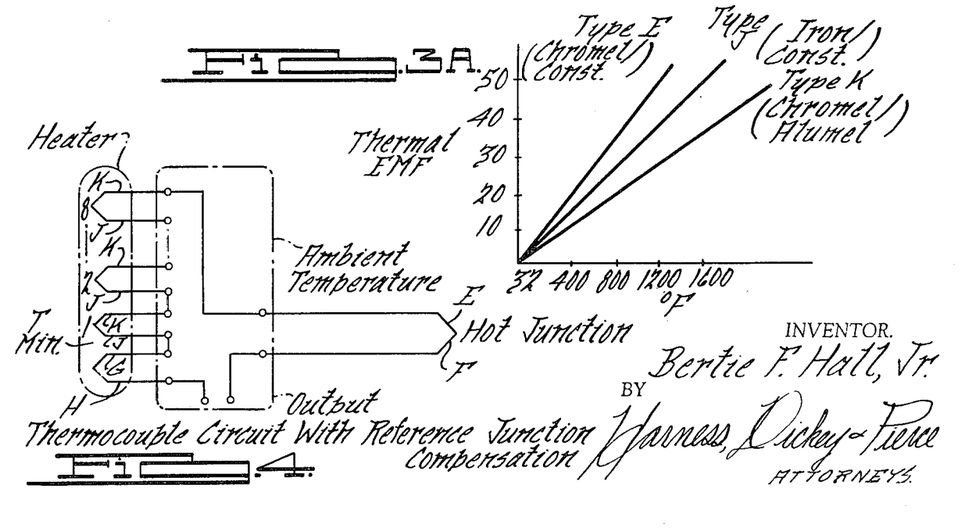
FIG. 3A is a graph depicting thermal E.M.F. versus temperature for various commercial thermocouples.
FIG. 4 is a schematic diagram depicting a reference junction compensation construction.

In addition to the above, the discoveries of the present invention can be applied to the construction of a thermocouple device for compensating for changes in the reference junction temperature of a thermocouple. Conventionally, in order to provide useful information with regard to the temperature to be measured, the output of a thermocouple is measured accurately and the temperature at the instrument end must be maintained at a constant known reference temperature or suitable compensation must be provided to reference the thermocouple output to some known reference temperature. In the past, compensation has been provided by relatively complex devices; one such device utilizes temperature sensitive resistors in a bridge circuit and rquires several carefully controlled components for accurate compensation. In the present invention application of the discoveries generally noted above results in a compensating device which is relatively inexpensive and accurate. A circuit arrangement of such a device is shown in FIG. 4. Note that the reference junction comprises thermocouples G/H and J/K with the hot junction comprising thermocouple E/F. The reference junction is held in a heater which is maintained at a preselected temperature which is to be determined.

Figure 5:
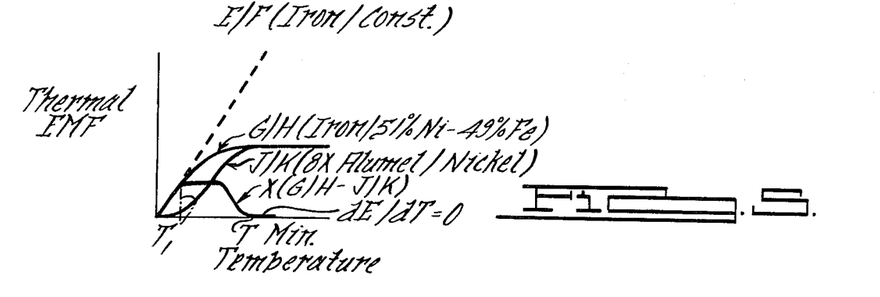
FIG. 5 is a graph depicting thermal E.M.F. versus temperature for deriving the reference junction compensation construction of FIG. 4.

Looking now to FIG. 5, curves are shown depicting the resultant devices. Thermocouple G/H is selected to have a linear, proportional characteristic as shown and is combined with the thermocouple J/K which is selected to have a different, nonlinear characteristic. The thermocouple E/F (at the hot junction) is shown as having a generally linear, proportional characteristic temperature response. The combination of the thermocouples G/H and J/K of the cold junction results in a device X having a nonlinear response as indicated in FIG. 5. Thermocouples G/H and J/K can be selected from the thermal E.M.F. versus temperature characteristics of the various materials (see FIG. 3); thermocouple G/H is iron and 51% Ni - 49% Iron while thermocouple C/D is comprised of a series of eight Alumel/Nickel, thermocouples, the thermocouple E/F is Iron/Constantan.

Note that the curve of device X has a substantial portion over which a generally uniform thermal E.M.F. (zero thermoelectric power) results over a substantial temperature range; by maintaining a heater at the reference junction at a temperature in this range, i.e. greater than T min., a constant reference junction thermal E.M.F. of zero will be provided by the thermocouple device X and the output of thermocouple E/F can be taken with no further compensation. Note also that there are a series of junctions resulting from the connection of thermocouple E/F to the reference junction device X; the device X has a slope from O to $T_1$ which coincides with the slope of thermocouple E/F for the same range with the range covering ambient temperature variations. Since the slopes are the same, these ambient junctions will cancel each other. Thus, the output at the hot junction can be determined with accuracy over the entire temperature range relative to a zero reference and independently of outside ambient temperature variations. Note that since there is a substantial temperature range over which the output of the device X will be constant, no critical voltage controlling devices are required for the heater and a relatively inexpensive, simple device is provided. The materials providing the thermocouples G/H and J/K can be derived as follows.

Examples of compensation for various thermocouple (hot junction) constructions are shown in Table A.

couple materials. Therefore, for Type J (first example) the voltage of the reference at 13.15 will be the equivalent of around 467° F. for a thermocouple made of hot junction thermocouple materials (Iron/Constantan); the major difference, however, is that the compensation device will accurately compensate at 13.15 mv. over a wide range of temperature (±75° F) whereas an equivalent device made of the hot junction materials to provide the same compensation could vary only slightly in temperature (±2° F).

Figure 6A:
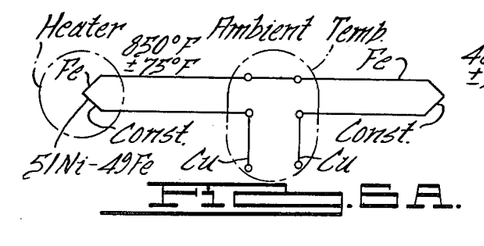
FIG. 6A is a schematic diagram of a thermocouple and compensating device.
Figure 6B:
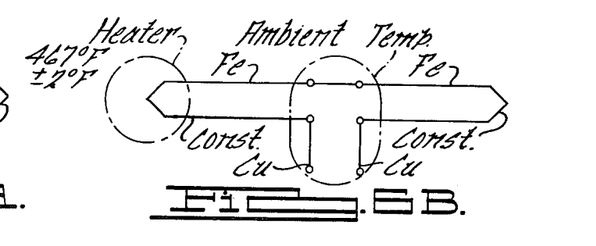
FIG. 6B is a schematic diagram of a conventional thermocouple using the conventional thermocouple for the reference junction.

FIGS. 6A and 6B are circuit diagrams with FIG. 6A showing the circuit for an Iron/Constantan (Type J) thermocouple with a compensator being an Iron/51% Ni-49%Fe thermocouple; note that with the compensa-

TABLE A

Design Examples of Reference Junction Compensation

I. Iron/Constantan - ISA Type J

| Temp. (°F.) | Thermal EMF (Millivolts)* | | |
|---|---|---|---|
| | Type J | Iron/51% Ni-Balance Iron | |
| 100 | 1.94 | 1.96 | ambient range |
| 200 | 4.91 | 4.89 | |
| 300 | 7.94 | 7.31 | |
| 400 | 11.03 | 9.45 | |
| 500 | 14.12 | 11.00 | |
| 600 | 17.18 | 12.10 | |
| 700 | 20.26 | 12.85 | Design for 850° F ± 75° F |
| 800 | 23.32 | 13.15 | |
| 900 | 26.40 | 13.12 | Effective Reference Junction. Temperature: 467° F. ± 2° F. (13.04 to 13.16 Mv.) |
| 1000 | 29.52 | 12.94 | |
| 1100 | 32.72 | 12.58 | |
| 1200 | 36.01 | 12.57 | |

*Calculations based on values for a 32° F Reference Junction.

II. Chromel/Alumel - ISA Type K

| Temp. (°F) | Thermal EMF (Millivolts)* | | X2 | |
|---|---|---|---|---|
| | Type K | Nickel/51% Ni-Balance Iron | | |
| 100 | 1.52 | 0.73 | 1.46 | ambient range |
| 200 | 3.82 | 1.81 | 3.62 | Design for 450° F |
| 300 | 6.09 | 2.45 | 4.90 | ± 75° F |
| 400 | 8.31 | 2.91 | 5.82 | Effective Reference |
| 500 | 10.57 | 2.91 | 5.82 | Junction Temp.: |
| 600 | 12.86 | 2.71 | 5.42 | 290° F ± 2° F |
| 700 | 15.18 | 2.51 | 5.02 | |
| 800 | 17.53 | 2.06 | 4.12 | |

*Calculations based on values for a 32° F reference junction.

III. Chromel/Constantan - ISA Type E

| Temp. (°F) | Thermal EMF (Millivolts)* | | X3 | |
|---|---|---|---|---|
| | Type E | Nickel/51% Ni-Balance Iron | | |
| 100 | 2.27 | 0.73 | 2.19 | ambient range |
| 200 | 5.87 | 1.81 | 5.43 | Design for 450° F |
| 300 | 9.71 | 2.45 | 7.35 | ± 75° F |
| 400 | 13.75 | 2.91 | 8.73 | Effective Refer ence |
| 500 | 17.95 | 2.91 | 8.73 | Junction Temp.: |
| 600 | 22.25 | 2.71 | 8.13 | 277° F ± 2° F |
| 700 | 26.65 | 2.51 | 7.53 | |

*Calculations based on values for a 32° F reference junction.

Looking to Table A, note that with Iron/Constantan (Type J) for a hot junction the use of a compensation device made of the alloy of 51% Nickel-49% Iron versus iron provides for a relatively uniform potential over a substantial temperature range and hence this design can be used to have compensation with the reference junction at 850° F., plus or minus 75° F., with the effective reference junction temperature being 467° F., plus or minus 2° F. Note that the effective reference junction temperature is determined by the potential set by the compensating, cold junction device and is equivalent to a cold junction made of the hot junction thermotor at 850° F a variation of ±75° F can occur with little variation in the compensating voltage; an equivalent circuit with Iron/Constantan at the reference junction is shown in FIG. 6B. Note that for the equivalent circuit to provide the same voltage compensation as the compensator of FIG. 6A the reference junction must be at 467° F; however, at this temperature the Iron/Constantan reference junction can be varied only ±20° F for the same resultant voltage variation recorded by the compensator of FIG. 6A for ±75° F variation; thus the compensator of the present invention permits a wide variation in temperature at the compensating temperature.

With regard to the thermocouple reference junction for compensation for a Chromel/Alumel (Type K) thermocouple, note that a pair of Nickel/51% Nickel-49% Iron thermocouples are used (indicated by the column X2) with the result that the reference junction can be held at 450° F., plus or minus 75° F., with the effective reference junction temperature being 290° F., plus or minus 2° F. Looking to the compensating device for the Chromel/Constantan (Type E) thermocouple, note that the combination of three thermocouples of the Nickel/51% Nickel-49% Iron are used (as noted in column X3) resulting in a reference junction designed for operation at 450° F., plus or minus 75° F., with an effective reference junction temperature of 277° F., plus or minus 2° F. The Thermal E.M.F. vs. Temperature curves for the Types E, J and K are shown in FIG. 3A.

Note from Table A that all of the compensation devices have around the same thermoelectric power at the low (ambient) temperature range such that the junctions created by the interconnection of the hot junction thermocouple and the compensator will have outputs which will cancel each other.

The discoveries of the present invention also lend themselves to other thermoelectric device applications. For example, it is possible by the proper combination of materials and/or the utilization of characteristics of various alloy materials to provide for thermoelectric devices having useful characteristics in addition to providing for compensating devices for thermocouple circuits such as providing a substantially constant voltage output source.

Figures 7, 8:
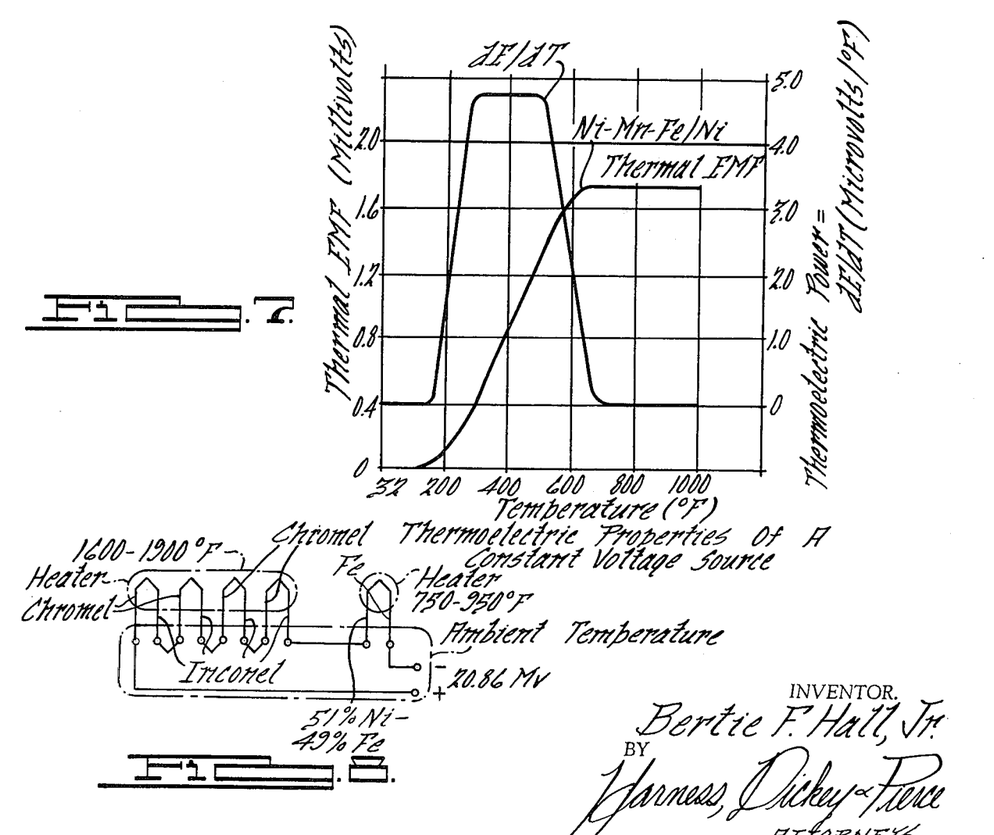
FIG. 7 is a graph depicting thermal E.M.F. versus temperature for a nickel-manganese-iron alloy versus nickel thermocouple.
FIG. 8 is a schematic diagram for a constant voltage source.

Looking now to FIG. 7, a Thermal E.M.F. versus Temperature curve for a Ni-Mn-Fe alloy (3% Ni, 0.5% Mn, remainder Fe) versus Nickel thermoelectric device is shown. The voltage developed is small but constant. The heated junction can vary from 700° to 1000° F. while the room temperature end can range from 150° F. to below freezing with no effect on the output voltage. Looking at the device in terms of thermoelectric power, the device will have a zero thermoelectric power over a substantial temperature range both at the high temperature and at the low temperature end. Note that the result is an effective, inexpensive constant voltage source; it is only necessary to provide a heater for the hot junction to maintain the temperature in the range of 700° – 1000° F.; obviously, no critical heater controls would be required. This simple thermoelectric device can act as a building block to arrive at higher voltages by series connection.

Table B and FIG. 8 show a constant voltage source using a plurality of junctions at the high temperature end.

TABLE B

| Temp. (° F) | E. M. F. (Millivolts) Chromel/Inconel | X4 | Temp. (° F) | Fe/51% Ni-Bal. Fe |
|---|---|---|---|---|
| 100 | .49 | 1.96 | 100 | 1.96 |
| 200 | 1.26 | 5.04 | 200 | 4.89 |
|  |  |  | 700 | 12.85 |
|  |  |  | 800 | 13.15 N13.10 |
|  |  |  | 900 | 13.12 |
|  |  |  | 1000 | 12.94 |
| 1600 | 8.48 | 33.92 |  |  |
| 1700 | 8.49 | 33.96 |  |  |
| 1800 | 8.49 | 33.96 |  |  |
| 1900 | 8.49 | 33.96 |  |  |

Net: 33.96 − 13.10 = 20.86 MV.

The low temperature junction is Iron/51% Ni-49% Fe; the high temperature junction device is a plurality of four Chromel/Inconel junctions in series. Note that at the low temperatures the four Chromel/Inconel junctions closely match the output of the Fe/51% Ni-49% Fe junction and hence the circuit of FIG. 8 will be generally insensitive to ambient temperature variations since the junctions located at ambient temperature will cancel each other. In the temperature range of from 700°–1000° F the low temperature junction will have a zero thermoelectric power and a thermal E.M.F. of approximately 13.10 mv.; the high temperature junction will have zero thermoelectric power and a thermal E.M.F. of around 33.96 in the temperature range of from 1600°–1900° F. By holding the low and high temperature junctions within the temperature ranges noted, the net result will be a constant voltage source having an output of 20.86 millivolts. Note that the constant voltage source of FIG. 8 is generally insensitive to substantial variations at both the high and low temperature ends as well as at the ambient temperature junctions.

There are other combinations which produce similar curves and different pairs of thermocouples may be connected in series or series-opposition to form composite curves to generate regions in which there is substantially constant voltage over an extended temperature range. It should be understood that the characteristics of the various metals and of the various combination of dissimilar metals and of various junctions and combination of junctions as used in the practice of the present invention are all within a reasonable, usable temperature range which would be approximately from around 0° to 2000° F.

In some thermoelectric applications non-metals have been used, i.e. carbon, carbides, arsenides, tellurides, etc., for purposes of simplicity the thermoelectric devices in the present application have been shown and described as comprising two dissimilar metals. It is to be understood that other suitable materials which are conductors of electricity, i.e. non-insulators, may be employed and are within the scope of the present invention.

While it will be apparent that the preferred embodiments of the invention disclosed are well calculated to fulfill the objects above stated, it will be appreciated that the invention is susceptible to modification, variation and change without departing from the proper scope or fair meaning of the subjoined claims.

What is claimed is:

1. A thermoelectric system comprising: a measuring thermocouple having an effective hot junction and an effective cold junction and having a known thermal voltage versus temperature curve with said effective hot junction being in a location at an elevated temperature to be measured, a thermoelectric reference voltage compensating device comprising a first hot and a first cold junction means for providing a first output potential in response to a difference in temperature between said first hot and cold junction means, first hot junction means comprising at least one hot junction thermoelectrically defined by a first pair of thermoelectrically dissimilar electrically conductive materials, said first cold junction means being with the said cold junction of said measuring thermocouple at a location at ambient temperature and comprising at least one cold junction thermoelectrically defined by a second pair of dissimilar electrically conductive materials, the same as said first pair, said first and second pairs of dissimilar electrically conductive materials having a predetermined thermoelectric characteristic of converting thermal energy to electrical energy being a thermal voltage differential between said dissimilar materials having a magnitude generally insensitive to changes in temperature at said first hot junction means over a substantially wide predetermined range of temperatures of at least 100° F at said hot junction means and having a thermal voltage versus temperature response at said ambient temperature to provide at said first cold junction means variations in thermal voltage for variations in temperature similar to that of said known thermal voltage versus temperature curve of said measuring thermocouple, heating means operatively connected with said first hot junction means for heating and maintaining said first hot junction means to a temperature within said temperature range, said ambient temperature being a non-controlled temperature in the range of at least 32° F to 100° F, and circuit means electrically connecting said first hot and cold junction means with said measuring thermocouple with said first cold junction means being connected in voltage opposition to the cold junction of said measuring thermocouple whereby variations in said ambient temperature will be compensated and including output conductor means for providing the thermal E.M.F. generated by the system as an indication of the temperature at the location of the hot junction of said measuring thermocouple.

2. The system of claim 1 with each of said first hot and cold junction means comprising a plurality of junctions having a predetermined effective reference junction temperature which effective reference remains generally constant over temperatures at said second junction means within said temperature range.

3. A thermoelectric device having hot and cold junctions of thermoelectrically dissimilar electrically conductive materials, said cold junction located at a non-temperature controlled location at ambient temperature within a range of at least 32° to 100° F, said materials being connected to define a hot junction together and having thermal voltage versus temperature curves relative to a third material which neither converge nor diverge and are spaced from each other for a portion covering a substantially wide predetermined range of temperatures at temperatures above the ambient temperature range and heating means for heating said hot junction to a temperature within said temperature range.

4. A thermoelectric device having hot and cold junctions of dissimilar electrically conductive materials having a preselected thermoelectric characteristic providing a reversal in polarity of thermoelectric power over a determinable substantially wide temperature range of at least 100° F at temperatures above ambient, and heating means for heating said hot junction to a temperature within said temperature range, said ambient being non-controlled temperatures in a range of at least 32° F to 100° F and being remote from the location of said heating means.

5. A thermoelectric constant voltage source comprising a plurality of junctions of thermoelectrically dissimilar electrically conductive materials, first junction means including one of said junctions and having a first voltage over a first substantially wide preselected temperature range providing substantially zero thermoelectric power and a second junction means including a different one of said junctions and having a second voltage over a different substantially wide preselected temperature range providing substantially zero thermoelectric power, connecting means electrically connecting said first and second junction means to an output and heating means for heating said one of said junctions to a temperature within said first temperature range being a range extending for at least 100° F, said other of said junctions being in a location at said second temperature range, said first voltage being greater than said second voltage whereby a constant voltage difference greater than zero is generated to provide a constant voltage source.

6. The voltage source of claim 5 with said first junction means comprising junctions of first thermoelectrically dissimilar electrically conductive materials and said second junction means comprising junctions of second different thermoelectrically dissimilar electrically conductive materials, said connecting means connecting said first junction means and said second junction means together at an output located at an ambient temperature, said first and second dissimilar electrically conductive materials having preselected thermal voltage versus temperature characteristics at ambient temperature such that the connecting junctions formed by said connecting means electrically cancel each other whereby variations in ambient temperature will substantially not affect the potential at said output, said ambient temperature being in a range of at least 32° F to 100° F and being at a nontemperature controlled location remote from said first and second temperature ranges and second heating means for heating said different one of said junctions to a temperature within said second temperature range being a range extending for at least 100° F.

7. The voltage source of claim 5 with each of the junctions of said first junction means being constructed of only two dissimilar electrically conductive materials.

8. A thermoelectric device having a hot and a cold junction of thermoelectrically dissimilar electrically conductive materials having a preselected thermoelectric characteristic providing zero thermoelectric power over a substantial temperature range, said hot and cold junctions being of the same dissimilar materials with said hot junction having a zero thermoelectric power at a first voltage over a first substantially wide temperature range and said cold junction having a zero thermoelectric power at a second voltage over a second substantially wide temperature range removed from said first temperature range, heating means for heating said hot junction to a temperature within said first temperature range said first voltage being greater than said second voltage whereby a constant voltage difference greater than zero is generated to provide a constant voltage source.

9. The device of claim 8 with said second temperature range including 32° to around 100° F and with said first voltage being greater than said second voltage by a difference of at least between 1.6 and 2.0 millivolts.

10. A thermoelectric system comprising: a measuring thermocouple having a first hot junction and a first cold junction, a thermoelectric device for compensating said measuring thermocouple including a second hot and a second cold junction of thermoelectrically dissimilar electrically conductive materials having a preselected thermoelectric characteristic providing zero thermoelectric power at a determinable voltage over a substantial temperature range above ambient, heating means for heating said second hot junction to a temperature within said temperature range, said second cold junction providing an output characteristic at ambient temperature having substantially the same thermoelectric power as said cold junction of said measuring thermocouple over a temperature range including the ambient temperature, said ambient temperature being the temperature at a non-temperature controlled location remote from said heating means and circuit means for connecting said measuring thermocouple with said thermoelectric device with said determinable voltage defining the reference temperature for the system.

11. A thermoelectric system comprising: a measuring thermocouple having an effective hot junction and an effective cold junction and having a known thermal voltage versus temperature curve with said effective cold junction being in a location at ambient temperature and with the hot junction being in a location at an elevated temperature to be measured, a thermoelectric reference voltage compensating device comprising a first hot and a first cold junction means for providing a first output potential in response to a difference in temperature between said first hot and cold junction means, said first hot junction means comprising a first junction thermoelectrically defined by a pair of thermoelectrically dissimilar electrically conductive materials, said cold junction means comprising a second junction thermoelectrically defined by a pair of the same thermoelectrically dissimilar electrically conductive materials; said pair of dissimilar electrically conductive materials having first and a second predetermined thermoelectric characteristic, said thermoelectric device being responsive to said first predetermined thermoelectric characteristic and generating a thermal voltage having a magnitude generally insensitive to changes in temperature at said hot junction means over a substantially wide predetermined range of temperatures, said thermoelectric device being responsive to said second predetermined thermoelectric characteristic and generating a thermal voltage having an output characteristic at ambient temperature substantially the same as that of the cold junction of said measuring thermocouple, and circuit means electrically connecting said measuring thermocouple and said thermoelectric device and including output conductor means for providing the thermal voltage generated by the device, and heating means operatively connected with said hot junction means for heating said hot junction means to a temperature within said temperature range, said cold junction means and the cold junction of said measuring thermocouple being at the same location at ambient temperature.

12. A thermoelectric device comprising a hot and a cold junction for providing an output potential in response to a difference in temperature between said hot and cold junctions, said hot junction comprising a first junction thermoelectrically defined by a pair of thermoelectrically dissimilar electrically conductive materials, said cold junction comprising a second junction thermoelectrically defined by a pair of the same dissimilar electrically conductive materials; said dissimilar electrically conductive materials having thermal voltage versus temperature curves relative to a third material which are spaced from each other and neither converge nor diverge for a portion covering a substantially wide range of temperatures at temperatures above ambient and generate a voltage greater than zero at temperatures within said temperature range, and circuit means electrically connecting the hot and cold junctions and including output conductor means for providing the thermal voltage generated by the device, and heating means operatively connected with said hot junction for heating said first junction to a temperature within said temperature range.

13. A thermoelectric device comprising a hot and a cold junction for providing an output potential in response to a difference in temperature between the hot and cold junctions, said hot junction comprising a first junction thermoelectrically defined by a pair of thermoelectrically dissimilar electrically conductive materials, said cold junction comprising a second junction thermoelectrically defined by a pair of the same dissimilar electrically conductive materials; said pair of dissimilar electrically conductive materials having a preselected thermoelectric characteristic for providing a reversal in polarity of thermoelectric power over a determinable predetermined temperature range at temperatures above ambient, and circuit means electrically connecting the hot and cold junctions and including output conductor means for providing the thermal voltage generated by the device, and heating means operatively connected with said hot junction for heating said first junction to a temperature within said temperature range, said ambient temperature being the non-controlled temperature at a location remote from said heating means.

14. A Thermoelectric system including a measuring thermocouple having a hot and cold junction and having a known thermal voltage versus temperature curve, with the cold junction being in a location at ambient temperature with the hot junction being in a location at an elevated temperature to be measured, a thermoelectric reference voltage compensating device comprising a first hot and a first cold junction means for providing a first output potential in response to a difference in temperature between said first hot and cold junction means, said first hot junction means comprising at least one hot junction thermoelectrically defined by a first pair of thermoelectrically dissimilar electrically conductive materials, said first cold junction means being with the cold junction of the measuring thermocouple at the location at ambient temperature and comprising at least one cold junction thermoelectrically defined by a second pair of the same dissimilar electrically conductive materials; said first and second pairs of dissimilar electrically conductive materials having a predetermined thermoelectric characteristic for generating a first thermal voltage having a magnitude generally insensitive to changes in temperature at said first hot junction means over a substantially wide predetermined range of temperatures at said hot junction means and having a thermal voltage versus temperature response at said ambient temperature to provide at said first cold junction means variations in thermal voltage for variations in temperature similar to that of said known thermal voltage versus temperature curve of said measuring thermocouple, and circuit means electrically connecting said first hot and cold junction means with said measuring thermocouple and including output conductor means for providing the thermal voltage generated by the system as an indication of the temperature at the location of the hot junction of the measuring thermocouple, and heating means operatively connected with said first hot junction means for heating said first hot junction means to a temperature within said temperature range, said ambient temperature being non-controlled temperature at a location remote from said heating means and from the location of the hot junction of the measuring thermocouple and the location of the hot junction of the measuring thermocouple being remote from said heating means.

15. The compensating device of claim 14 with said wide range of temperatures being a range of at least 100° F, said first hot junction means comprising a first plurality of effective hot junctions like said first hot junction and with said first cold junction means comprising a second plurality of effective cold junctions like said first cold junction with said first and second pluralities being the same in number, said circuit means electrically connecting said second plurality of effective cold junctions and the cold junction of the measuring thermocouple at ambient temperature with the thermal voltage variations of said second plurality of effective cold junctions and the cold junction of the measuring thermocouple resulting from variations in ambient temperature canceling, said ambient temperature being in a range of at least 32° F to 100° F.

16. A thermoelectric constant voltage device comprising a first hot and a first cold junction means for providing a first output potential in response to a difference in temperature between said first hot and cold junction means, said first hot junction means comprising a first plurality of hot junctions defined by first pairs of thermoelectrically dissimilar electrically conductive materials, said first cold junction means comprising second pairs of the same thermoelectrically dissimilar electrically conductive materials; said first and second plurality being the same in number said first pairs of dissimilar electrically conductive materials having a predetermined thermoelectric characteristic for generating a first thermal voltage having a magnitude generally insensitive to changes in temperature at said first hot junction means over a first substantially wide range of temperatures, a second hot and a second cold junction means for providing a second output potential in response to a difference in temperature between said second hot and cold junction means, said second hot junction means of a second hot junction defined by a first pair or different thermoelectrically dissimilar electrically conductive materials, said second cold junction means comprising a second cold junction defined by a second pair of said different thermoelectrically dissimilar electrically conductive materials, said first pair of said different materials having a predetermined thermoelectric characteristic for generating a second thermal voltage having a magnitude generally insensitive to changes in temperature at said second hot junction means over a second substantially wide range of temperatures removed from said first range of temperatures, first heating means operatively connected with said first hot junction means for heating said first hot junction means to a temperature within said first temperature range, and second heating means operatively connected with said second hot junction means for heating said second hot junction means to a temperature within said second temperature range, and circuit means electrically connecting said first and second hot and cold junction means and including output conductor means for providing the thermal voltage generated by the device, said first and second cold junction means located at ambient temperature, said second plurality of effective cold junctions and said second cold junction means varying similarly in thermal voltage for changes in ambient temperature with said circuit means connecting said second plurality of effective cold junction and said second cold junction means whereby the thermal voltage variations resulting from variations in ambient temperature will cancel, said ambient temperature being the non-controlled temperature at a location remote from said first and second heating means.

* * * * *

UNITED STATES PATENT AND TRADEMARK OFFICE
CERTIFICATE OF CORRECTION

PATENT NO. : 3,992,229
DATED : November 16, 1976
INVENTOR(S) : Bertie F. Hall, Jr.

It is certified that error appears in the above-identified patent and that said Letters Patent are hereby corrected as shown below:

Column 3, line 18, delete "with" and substitute therefor --will--

Column 6, line 65, delete "20°F" and substitute therefor --2°F--

Column 12, line 37, after "determinable" insert --wide--

Column 12, line 51, after "temperature" insert --and--

Column 14, line 13, delete "of" and substitute therefor --comprising--

Column 14, line 14, delete "or" and substitute therefor --of--

Signed and Sealed this

Twenty-second Day of March 1977

[SEAL]

Attest:

RUTH C. MASON
*Attesting Officer*

C. MARSHALL DANN
*Commissioner of Patents and Trademarks*